(12) United States Patent
White et al.

(10) Patent No.: US 7,784,164 B2
(45) Date of Patent: Aug. 31, 2010

(54) ELECTRONIC DEVICE MANUFACTURING CHAMBER METHOD

(75) Inventors: John M. White, Hayward, CA (US); Donald Verplancken, Burlingame, CA (US); Shinichi Kurita, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 867 days.

(21) Appl. No.: 11/214,475

(22) Filed: Aug. 29, 2005

(65) Prior Publication Data

US 2006/0101728 A1    May 18, 2006

Related U.S. Application Data

(63) Continuation-in-part of application No. 11/145,003, filed on Jun. 2, 2005.

(60) Provisional application No. 60/587,109, filed on Jul. 12, 2004, provisional application No. 60/576,902, filed on Jun. 2, 2004.

(51) Int. Cl.
    B23P 11/00    (2006.01)
(52) U.S. Cl. .................... 29/428; 414/935; 414/939
(58) Field of Classification Search ............ 29/897, 29/428; 414/935, 939
See application file for complete search history.

(56) References Cited

U.S. PATENT DOCUMENTS 4,455,177 A    6/1984    Filippov et al.
4,632,624 A    12/1986    Mirkovich et al.
4,649,612 A *   3/1987    Sakamaki et al. ...... 29/888.025
4,790,750 A    12/1988    Bourel et al.
5,085,887 A    2/1992    Adams et al.
5,186,718 A    2/1993    Tepman et al.
5,417,537 A    5/1995    Miller
5,421,957 A    6/1995    Carlson et al.
5,877,086 A    3/1999    Aruga
5,934,856 A    8/1999    Asakawa et al.
6,010,133 A    1/2000    Boyd et al.
6,019,839 A    2/2000    Achutharaman et al.
6,045,620 A    4/2000    Tepman et al.
6,093,252 A    7/2000    Wengert et al.

(Continued)

FOREIGN PATENT DOCUMENTS

CN          1573481        2/2005

(Continued)

OTHER PUBLICATIONS

Chinese Office Action of 200510103895.2 dated Feb. 13, 2009.

(Continued)

*Primary Examiner*—Jermie E Cozart
(74) *Attorney, Agent, or Firm*—Dugan & Dugan, PC (57) ABSTRACT

A non-polygon shaped, multi-piece chamber is provided. A non-polygon shaped, multi-piece chamber may include (1) a central piece having a first side and a second side, (2) a first side piece adapted to couple with the first side of the central piece, and (3) a second side piece adapted to couple with the second side of the central piece. The central piece, the first side piece, and the second side piece form a cylindrical overall shape when coupled together. Numerous other aspects are provided.

10 Claims, 11 Drawing Sheets

U.S. PATENT DOCUMENTS

| | | | |
|---|---|---|---|
| 6,099,697 | A | 8/2000 | Hausmann |
| 6,201,999 | B1 | 3/2001 | Jevtic |
| 6,216,328 | B1 | 4/2001 | Boyd et al. |
| 6,257,827 | B1* | 7/2001 | Hendrickson et al. ........ 414/805 |
| 6,267,917 | B1* | 7/2001 | Guzikowski et al. ..... 264/297.6 |
| 6,286,451 | B1 | 9/2001 | Ishikawa et al. |
| 6,305,565 | B1 | 10/2001 | Boyd et al. |
| 6,326,597 | B1 | 12/2001 | Lubomirsky et al. |
| 6,383,330 | B1 | 5/2002 | Raaijmakers |
| 6,390,019 | B1 | 5/2002 | Grimbergen et al. |
| 6,440,261 | B1 | 8/2002 | Tepman et al. |
| 6,503,365 | B1 | 1/2003 | Kim et al. |
| 6,517,304 | B1 | 2/2003 | Matsumoto |
| 6,530,732 | B1* | 3/2003 | Theriault et al. ............. 414/217 |
| 6,538,388 | B2 | 3/2003 | Nakano et al. |
| 6,540,869 | B2* | 4/2003 | Saeki et al. ............ 156/345.31 |
| 6,634,845 | B1 | 10/2003 | Komino |
| 6,659,111 | B1 | 12/2003 | Mouri et al. |
| 6,691,876 | B2 | 2/2004 | Tsai et al. |
| 6,698,991 | B1 | 3/2004 | Bachrach et al. |
| 6,736,149 | B2* | 5/2004 | Biberger et al. ................ 134/66 |
| 6,818,067 | B2 | 11/2004 | Doering et al. |
| 6,926,798 | B2* | 8/2005 | Biberger et al. ........ 156/345.31 |
| 6,950,721 | B2* | 9/2005 | Tashiro et al. ............... 700/213 |
| 6,977,014 | B1 | 12/2005 | Stevens et al. |
| 7,018,517 | B2 | 3/2006 | Kurita et al. |
| 7,060,422 | B2* | 6/2006 | Biberger et al. ............. 430/329 |
| 7,282,460 | B2* | 10/2007 | Jang .......................... 438/800 |
| 7,313,262 | B2* | 12/2007 | Lin et al. .................... 382/145 |
| 2001/0016364 | A1 | 8/2001 | Loan et al. |
| 2001/0036393 | A1 | 11/2001 | Kroeker |
| 2002/0000198 | A1 | 1/2002 | Ishikawa et al. |
| 2002/0033232 | A1 | 3/2002 | Raaijmakers |
| 2004/0055537 | A1 | 3/2004 | Kurita et al. |
| 2004/0076505 | A1 | 4/2004 | Kinnard et al. |
| 2004/0200415 | A1 | 10/2004 | Maegawa et al. |
| 2004/0221811 | A1 | 11/2004 | Mitchell et al. |
| 2004/0240971 | A1 | 12/2004 | Tezuka et al. |
| 2004/0240983 | A1* | 12/2004 | Jang .......................... 414/935 |
| 2005/0005849 | A1 | 1/2005 | Masuoka |
| 2005/0095088 | A1 | 5/2005 | Kurita et al. |
| 2005/0205012 | A1 | 9/2005 | Jang |
| 2006/0051507 | A1 | 3/2006 | Kurita et al. |
| 2006/0157340 | A1 | 7/2006 | Kurita |
| 2006/0201074 | A1 | 9/2006 | Kurita |
| 2006/0263177 | A1 | 11/2006 | Van der Meulen |
| 2007/0020890 | A1 | 1/2007 | Thakur et al. |
| 2007/0141748 | A1 | 6/2007 | Rice |
| 2007/0166133 | A1 | 7/2007 | Lee et al. |
| 2007/0183869 | A1 | 8/2007 | Cho et al. |
| 2008/0025821 | A1 | 1/2008 | White et al. |

FOREIGN PATENT DOCUMENTS

| | | |
|---|---|---|
| CN | 1574232 | 2/2005 |
| EP | 0 928 014 A2 | 7/1999 |
| EP | 1 065 701 A2 | 1/2001 |
| JP | 5-347130 | 12/1993 |
| JP | 11-089026 | 3/1999 |
| JP | 11-089027 | 3/1999 |
| JP | 11-510562 | 9/1999 |
| JP | 2000-167788 | 6/2000 |
| JP | 2000-514601 | 10/2000 |
| JP | 2001-298010 | 10/2001 |
| JP | 2002-001100 | 1/2002 |
| JP | 2002158090 | 5/2002 |
| JP | 2004-335743 | 11/2004 |
| JP | 2006114874 | 4/2006 |
| KR | 10-2003-0035350 | 6/2003 |
| KR | 10-0441875 | 7/2004 |
| KR | 2006-0049499 | 5/2006 |
| TW | 0406285 B | 9/2000 |
| TW | 0408421 B | 10/2000 |
| TW | 0471017 B | 1/2002 |
| TW | 0504732 B | 10/2002 |
| TW | 0541580 B | 7/2003 |
| TW | 0567574 B | 12/2003 |
| WO | WO 97/06288 | 2/1997 |
| WO | WO 2004/001817 A1 | 12/2003 |
| WO | WO 2006/130811 | 12/2006 |

OTHER PUBLICATIONS

Japanese Office Action of P2005-163072 dated Mar. 17, 2009.
Taiwan Application No. 095203932 Office Action dated Oct. 2, 2006.
IPRP and WO of PCT/US06/021404 dated Dec. 21, 2007.
Chinese Divisional Application No. 200710106347.4 OA dated Sep. 19, 2008.
Taiwanese Application No. 94118029 OA dated Dec. 21, 2007.
ISR and WO of PCT/US06/021404 dated Dec. 21, 2006.
Taiwanese Application No. 94118029 SR dated Jun. 23, 2007.
U.S. Appl. No. 60/576,902, filed Jun. 2, 2004.
U.S. Appl. No. 60/587,109, filed Jul. 12, 2004.
Chinese Application No. 200510103895.2 OA dated Sep. 14, 2007.
Chinese Application No. 200510103895.2 OA dated Mar. 2, 2007.
Chinese Office Action of 00510103895.2 dated Jun. 19, 2009.
Korean Office Action dated Nov. 20, 2008 for Korean Application No. 10-2007-7024451.
ISR and Wo for International Application No. PCT/US07/73521 dated Jul. 8, 2008.
Korean Office Action dated May 22, 2009 for Korean Application No. 10- 2007-7024451.
IPRP and WO of PCT/US07/73521 dated Feb. 5, 2009.
Chinese Application No. 200710106347.4 Office Action dated Jul. 10, 2009.
Japanese Final Office Action dated Sep. 15, 2009 for Japanese Application No. 2005-163072.
Office Action of U.S. Appl. No. 11/145,003 mailed Sep. 25, 2008.
Dec. 12, 2008 Response to Office Action of U.S. Appl. No. 11/145,003 mailed Sep. 25, 2008.
Final Office Action of U.S. Appl. No. 11/145,003 mailed Feb. 2, 2009.
May 4, 2009 Repsonse to Final Office Action of U.S. Appl. No. 11/145,003 mailed Feb. 2, 2009.
Office Action of U.S. Appl. No. 11/145,003 mailed Jun. 23, 2009.
Sep. 23, 2009 Response to Office Action of U.S. Appl. No. 11/145,003 mailed Jun. 23, 2009.
Office Action of U.S. Appl. No. 11/366,831 mailed Aug. 18, 2008.
Dec. 12, 2008 Response to Office Action of U.S. Appl. No. 11/366,831 mailed Aug. 18, 2008.
Final Office Action of U.S. Appl. No. 11/366,831 mailed Feb. 9, 2009.
Supplemental Final Office Action of U.S. Appl. No. 11/366,831 mailed Feb. 24, 2009.
Apr. 24, 2009 Response to Supplemental Final Office Action of U.S. Appl. No. 11/366,831 mailed Feb. 24, 2009.
Office Action of U.S. Appl. No. 11/366,831 mailed Jul. 7, 2009.
Office Action of U.S. Appl. No. 11/386,257 mailed Jul. 30, 2009.
Office Action of U.S. Appl. No. 11/459,655 mailed Sep. 21, 2007.
Dec. 21, 2007 Response to Office Action of U.S. Appl. No. 11/459,655 mailed Sep. 21, 2007.
Final Office Action of U.S. Appl. No. 11/459,655 mailed Apr. 2, 2008.
May 15, 2009 Response to Final Office Action of U.S. Appl. No. 11/459,655 mailed Apr. 2, 2008.
Office Action of U.S. Appl. No. 11/459,655 mailed Feb. 4, 2009.
Aug. 2, 2009 Response to Office Action of U.S. Appl. No. 11/459,655 mailed Feb. 4, 2009.
Office Action of U.S. Appl. No. 10/601,185 mailed Dec. 1, 2004.
Mar. 1, 2005 Response to Office Action of U.S. Appl. No. 10/601,185 mailed Dec. 1, 2004.
Final Office Action of U.S. Appl. No. 10/601,185 mailed May 27, 2005.

Sep. 27, 2005 Response to Final Office Action of U.S. Appl. No. 10/601,185 mailed May 27, 2005.
Notice of Allowance of U.S. Appl. No. 10/601,185 mailed Oct. 19, 2005.
Jun. 11, 2008 Preliminary Amendment of U.S. Appl. No. 11/145,003.
Advisory Action of U.S. Appl. No. 11/145,003 mailed May 15, 2009.
Jun. 2, 2009 Amendment of U.S. Appl. No. 11/145,003.
Advisory Action of U.S. Appl. No. 11/366,831 mailed May 12, 2009.
Oct. 7, 2009 Response to Office Action of U.S. Appl. No. 11/366,831 mailed Jul. 7, 2009.
Final Office Action of U.S. Appl. No. 11/145,003 mailed Nov. 3, 2009.
Nov. 30, 2009 Response to Office Action of U.S. Appl. No. 11/386,257 mailed Jul. 30, 2009.
Final Office Action of U.S. Appl. No. 11/459,655 mailed Dec. 7, 2009.
Final Office Action of U.S. Appl. No. 11/366,831 mailed Dec. 30, 2009.
Feb. 3, 2010 Response to Final Office Action of U.S. Appl. No. 11/145,003 mailed Nov. 3, 2009.
Notice of Allowance of U.S. Appl. No. 11/145,003 mailed Feb. 25, 2010.
Final Office Action of U.S. Appl. No. 11/386,257 mailed Mar. 11, 2010.
Supplemental Final Office Action of U.S. Appl. No. 11/366,831 mailed Apr. 20, 2010.
May 11, 2010 Response to Final Office Action of U.S. Appl. No. 11/386,257 mailed Mar. 11, 2010.
Advisory Action of U.S. Appl. No. 11/386,257 mailed May 20, 2010.
Notice of Allowance of U.S. Appl. No. 11/145,003 mailed May 27, 2010.
Supplemental Response to Final Office Action of U.S. Appl. No. 11/386,257 filed Jun. 11, 2010.
Response to Supplemental Final Office Action of U.S. Appl. No. 11/366,831 filed Jun. 21, 2010.

* cited by examiner

ELECTRONIC DEVICE MANUFACTURING CHAMBER METHOD

The present application is a continuation-in-part of and claims priority from U.S. patent application Ser. No. 11/145,003, filed Jun. 2, 2005 is still pending and titled "ELECTRONIC DEVICE MANUFACTURING CHAMBER AND METHODS OF FORMING THE SAME", which claims priority from U.S. Provisional Patent Application Ser. No. 60/576,902, filed Jun. 2, 2004 and titled "SEMICONDUCTOR DEVICE MANUFACTURING TOOL AND METHODS FOR USING THE SAME" and U.S. Provisional Patent Application Ser. No. 60/587,109, filed Jul. 12, 2004 and titled "ELECTRONIC DEVICE MANUFACTURING TOOL AND METHODS FOR USING THE SAME". Each of these patent applications is hereby incorporated by reference herein in its entirety for all purposes.

FIELD OF THE INVENTION

The present invention relates generally to flat panel display and/or electronic device manufacturing, and more particularly to an electronic device manufacturing chamber and methods of forming the same.

BACKGROUND OF THE INVENTION

As substrates used in flat panel displays increase in size, the dimensions of electronic device manufacturing chambers (e.g., processing and/or transfer chambers) used to manufacture the larger flat panel displays also must increase in size. However, the difficulty of manufacturing and transporting such chambers also increases with chamber size due to the overall dimensions and/or weight of the chambers. As such, a need exists for improved electronic device manufacturing chambers used for manufacturing large flat panel displays, as well as for improved methods of transporting such chambers.

SUMMARY OF THE INVENTION

In certain aspects, the present invention provides an apparatus that includes a plurality of chamber pieces adapted to fit together to form a non-polygon shaped electronic device manufacturing chamber. The chamber pieces individually have dimensions that comply with ground and/or air transportation regulations. However, an overall dimension of the non-polygon shaped electronic device manufacturing chamber does not comply with ground and/or air transportation regulations.

In certain aspects, the present invention provides an apparatus that includes (1) a first chamber piece having a lateral cross-sectional shape of a portion of an ellipse cut by two cords such that the shape includes two curve segments, a first line segment, and a second line segment; (2) a second chamber piece having a lateral cross-sectional shape of a portion of an ellipse cut by a cord such that the shape includes a curve segment and a third line segment; and (3) a third chamber piece having a lateral cross-sectional shape of a portion of an ellipse cut by a cord such that the shape includes a curve segment and a fourth line segment. The chamber pieces are adapted to fit together to form a shape of an elliptical cylinder.

In certain aspects, the present invention provides an apparatus that includes (1) a first chamber piece; (2) a second chamber piece adapted to be coupled to the first chamber piece; and (3) a third chamber piece adapted to be coupled to the first chamber piece. The first chamber piece includes a top having a shape formed from two curve segments, a first line segment, and a second line segment. The second chamber piece includes a top having a shape formed from one curve segment and one line segment. The third chamber piece includes a top having a shape formed from one curve segment and one line segment.

The first line segment of the first chamber piece is approximately equal in length to the line segment of the second chamber piece, and the second line segment of the first chamber piece is approximately equal in length to the line segment of the third chamber piece. The two curve segments of the first chamber piece, the curve segment of the second chamber piece, and the curve segment of the third chamber piece form an ellipse when the second and third chamber pieces are coupled to the first chamber piece.

In certain aspects, the present invention provides a method that includes transporting a plurality of separate chamber pieces that are adapted to fit together to form a non-polygon shaped transfer chamber. The pieces include a plurality of recessed facets, each recessed facet being adapted to be a coupling point to another chamber and including at least one opening. The method also includes assembling the separate chamber pieces into the non-polygon shaped transfer chamber.

Other features and aspects of the present invention will become more fully apparent from the following detailed description, the appended claims and the accompanying drawings.

DETAILED DESCRIPTION OF THE INVENTION

Figure 1:
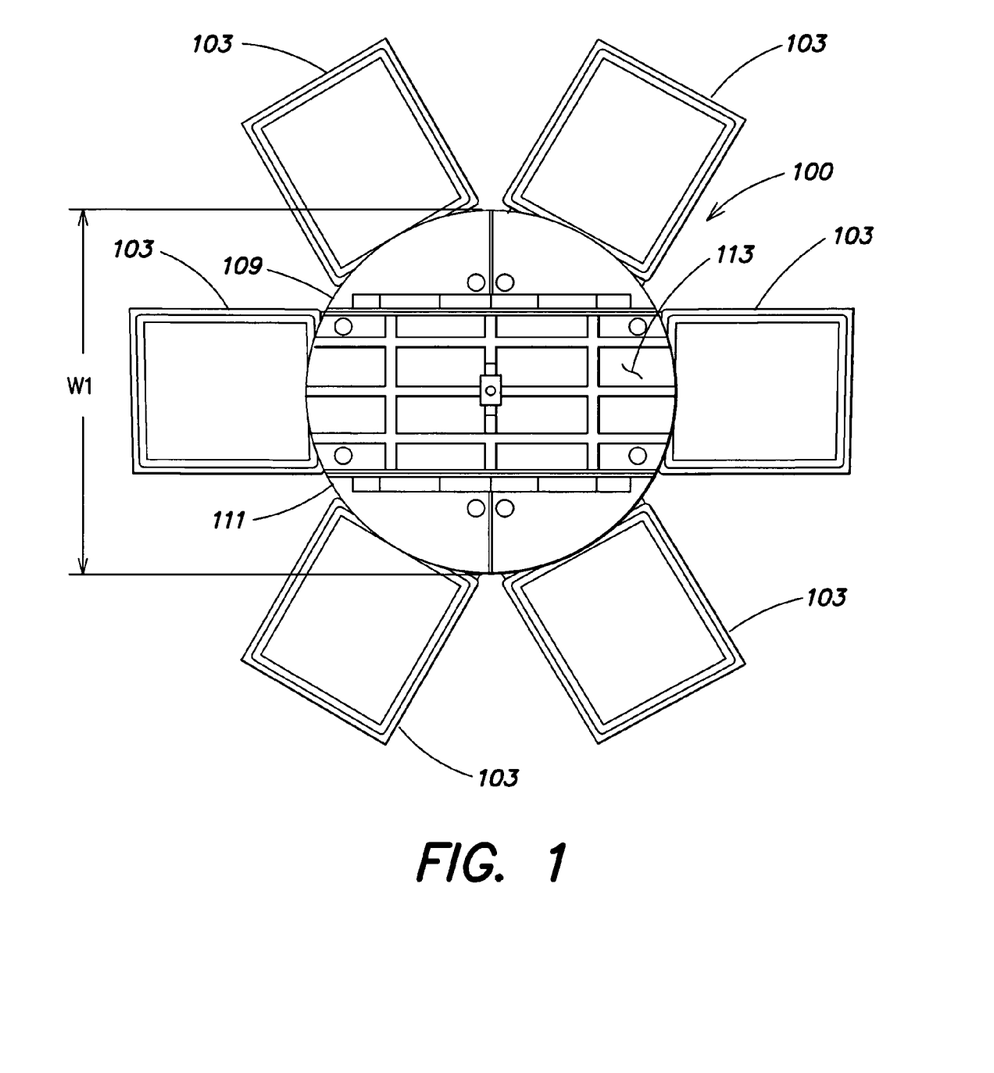
FIG. 1 is a top view of a first exemplary multi-piece electronic device manufacturing chamber in accordance with some embodiments of the present invention.

FIG. 1 is a top view of a first exemplary multi-piece electronic device manufacturing chamber 100 in accordance with some embodiments of the present invention. With reference to FIG. 1, the multi-piece electronic device manufacturing chamber 100 is a transfer chamber for transporting substrates during electronic device manufacturing. The transfer chamber 100 is coupled to one or more processing chambers and/or load locks 103 during electronic device manufacturing. The transfer chamber 100 may include an end effector (not shown) for transporting a substrate among the processing chambers and/or load locks 103 during electronic device manufacturing. Exemplary substrates may include, for example, a glass plate, a polymer substrate, a semiconductor wafer, a mask, a reticule, or the like.

In accordance with some embodiments of the invention, the transfer chamber 100 may include multiple pieces which are coupled together. More specifically, the transfer chamber 100 may include a first piece 109 (e.g., a first side piece) and a second piece 111 (e.g., a second side piece) coupled to a third piece 113 (e.g., a center piece). The first piece 109 and second piece 111 may each be coupled to the third piece 113 via an O-ring (not separately shown). The first piece 109 and second piece 111 may each be secured to the third piece 113 using securing means, such as screws, bolts, or the like. Although, the multi-piece electronic device manufacturing chamber 100 of FIG. 1 includes three pieces, the multi-piece electronic device manufacturing chamber may include a larger or smaller number of pieces (e.g., 2, 4, 5, 6, etc.).

The width of conventional transfer chambers (e.g., one-piece transfer chambers) is generally limited to about 3 m or less to comply with or accommodate ground and/or air transportation regulations, transport capacity and/or building design. For example, a transfer chamber larger than about 3 m may be barred by local regulation from transport in most normal capacity freight airplanes (e.g., the Boeing 747) and may be too large to fit through entrance doorways in a standard electronic device fabrication facility. In contrast, in one or more embodiments of the present invention, the width W1 of the multi-piece transfer chamber, when assembled (e.g., the overall width), is 4.2 meters. Therefore, the present electronic device manufacturing chamber 100 can accommodate a larger substrate than can conventional, one-piece transfer chambers. The electronic device manufacturing chamber 100 may be of a larger or smaller width than 4.2 meters.

In accordance with some embodiments of the invention, from a top view or a lateral cross-sectional view, the shapes of each of the exemplary multi-piece electronic device manufacturing chamber pieces 109-113 resemble a circle cut by one or more cords. For example, from a top view or a lateral cross-sectional view, the side pieces 109, 111 resemble a portion of a circle (or, more generally, an ellipse) cut by a cord. Likewise, from a top view or a lateral cross-sectional view, the center piece 113 resembles a portion of a circle cut by two parallel cords. This shape includes two curve segments and two line segments. The shapes of the side pieces 109,111 include a curve segment and a line segment. Note that none of the individual pieces 109-113 has a polygon shape. In other words, each of the pieces 109-113 includes at least one curve segment.

From a top view, or a lateral cross-sectional view, the shape of the exemplary multi-piece electronic device manufacturing chamber 100 when assembled (e.g., the combined shape) is a circle. The overall shape of the exemplary multi-piece electronic device manufacturing chamber 100 when assembled (e.g., the three-dimensional shape) is cylindrical. However, the multi-piece electronic device manufacturing chamber 100 may have other overall shapes (e.g., ecliptically cylindrical) including various non-polygonal shapes. Such non-polygonal shaped chambers, particularly symmetrical non-polygonal shaped chambers (e.g., a cylinder shaped chamber) may provide the most useable internal substrate transfer area for a given amount of chamber material. For example, compared to a polygon shaped chamber, a non-polygon shaped chamber does not include unusable corner areas. As such, the weight of a non-polygon shaped chamber for a given amount of useable internal substrate transfer area may be less than a polygon shaped chamber with an equivalent amount of useable internal substrate transfer area.

Figure 2A:
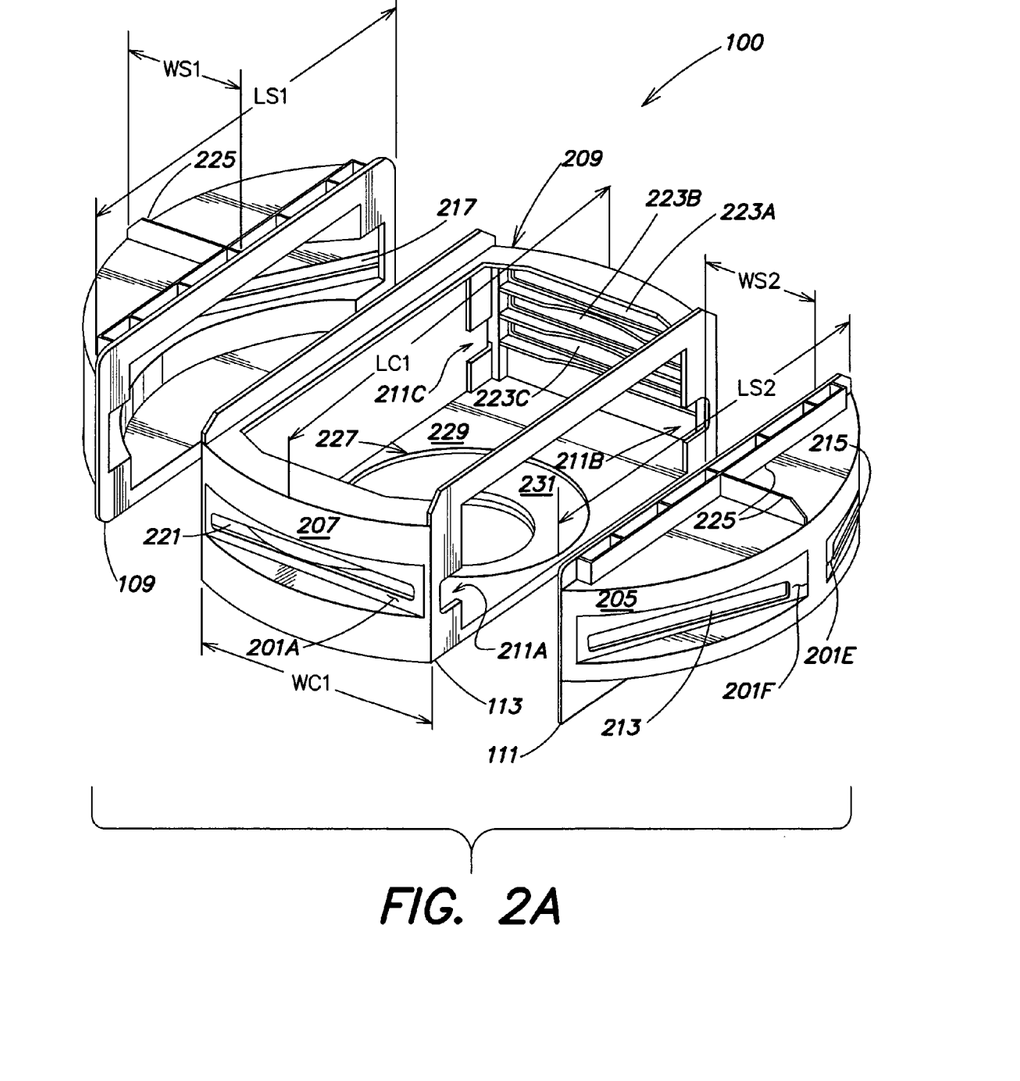
FIG. 2A is an exploded isometric view of the first exemplary multi-piece electronic device manufacturing chamber of FIG. 1 in accordance with some embodiments of the present invention.

FIG. 2A is an exploded isometric view of the first exemplary multi-piece electronic device manufacturing chamber 100 (rotated relative to the depiction in FIG. 1) in accordance with some embodiments of the present invention. Each of the first through third pieces 109-113 may be coupled horizontally to form the multi-piece electronic device manufacturing chamber 100. The length of the first piece 109 is represented by LS1 and the largest width (e.g., the width at the widest point) of the first piece 109 is represented by WS1. The length of second piece 111 is represented by LS2 and the largest width of the second piece 111 is represented by WS2. The largest length (e.g., the length at the longest point) of the third piece 113 is represented by LC1 and the width of the third piece 113 is represented by WC1.

In one or more embodiments, the largest width WC1 of the third piece 113 is about 2.4 m and the largest length LC1 of the third piece 113 is about 4.2 meters. Larger or smaller lengths and/or widths may be employed for the third piece 113. In the embodiment shown, the largest length LC1 of the third piece 113 is also the overall diameter of the chamber 100. As shown, the length LS1 of the first piece 109 and the length LS2 of the second piece 111 are equal to the length of the sides of third piece 113. However, the length LS1 of the first piece 109 and/or the length LS2 of the second piece 111 may be different. In one embodiment the width WS1 of the first piece 109 and/or the width WS2 of the second piece 111 are each about 0.9 meters. However, the width WS1 of the first piece 109 and/or the width WS2 of the second piece 111 may be different (e.g., larger or smaller) and/or different than each other. (In one particular embodiment, the third piece 113 may have a width that is approximately equal to or less than the width of the first piece 109 plus the width of the second piece 111, although other relationships between the widths of the first, second and third pieces 109, 111 and 113 may be employed).

Each piece 109-113 of the multi-piece electronic device manufacturing chamber 100 may be made of, for example, aluminum, stainless steel, or any practicable, relatively inert material suitable for use as a transfer chamber.

Although the overall dimensions of the multi-piece electronic device manufacturing chamber 100 do not comply with ground and/or air transportation regulations, the dimensions of each piece 109-113 of the multi-piece electronic device manufacturing chamber 100 do comply with ground and/or air transportation regulations. More specifically, in the example described above, the overall width W1 of the multi-piece electronic device manufacturing chamber 100 is 4.2 m, which does not comply with ground and/or air transportation regulations. However, the width WS1 of the first piece 109 and the width WS2 of the second piece 111 are each 0.9 m and the width WC1 of the third piece 113 is 2.4 m, each of which complies with ground and/or air transportation regulations. (In another embodiment, the width WC1 of the third piece 113 may be about 3 to 3.2 m and the widths WS1, WS2 of the first and second pieces 109, 111 may each be about 0.5 to 0.6 m.)

Further, each piece 109-113 of the multi-piece electronic device manufacturing chamber 100 may be fabricated in a conventional machining center or shop. Therefore, a manufacturer of the multi-piece electronic device manufacturing chamber 100 may select one or more of a plurality of conventional machining centers or shops to fabricate the pieces 109-113 of the multi-piece electronic device manufacturing chamber 100. Competition among the plurality of conventional machining centers or shops enables the manufacturer of the multi-piece electronic device manufacturing chamber 100 to obtain a better price. In contrast, the number of machining centers or shops that may fabricate a one-piece electronic device manufacturing chamber with dimensions that can accommodate larger substrates, similar to the multi-piece electronic device manufacturing chamber 100, is limited. This limited number of machining centers or shops results in reduced competition. Due to reduced competition, the manufacturer may pay more for fabrication of such a one-piece chamber than for the multi-piece semiconductor manufacturing chamber 100. Further, because such a one-piece chamber does not comply with ground and/or air transportation regulations, the manufacturer of such a one-piece chamber may need to obtain special accommodations, such as a police escort, an "Oversized Load" sign, or the like, while transporting the chamber. The multi-piece electronic device manufacturing chamber 100 does not require such accommodations.

Figure 2B:
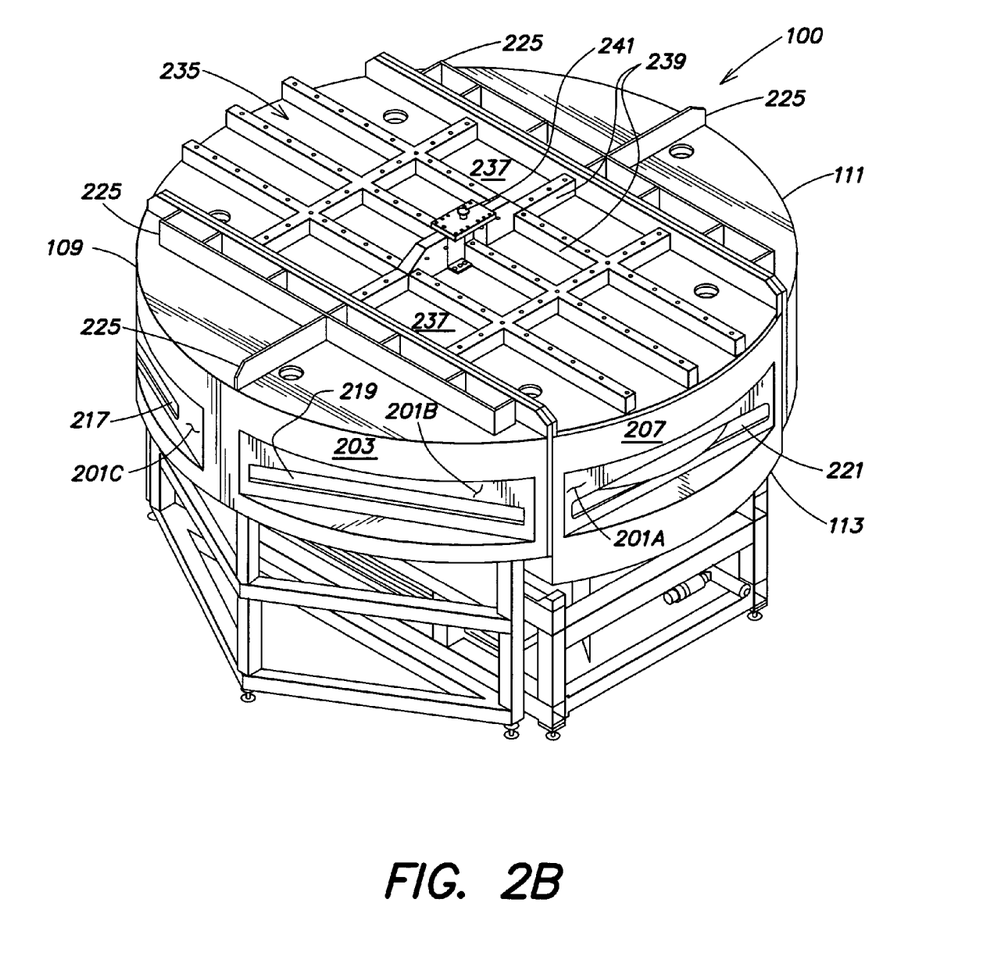
FIG. 2B is an isometric view of the first chamber of FIG. 2A when assembled.
Figure 2C:
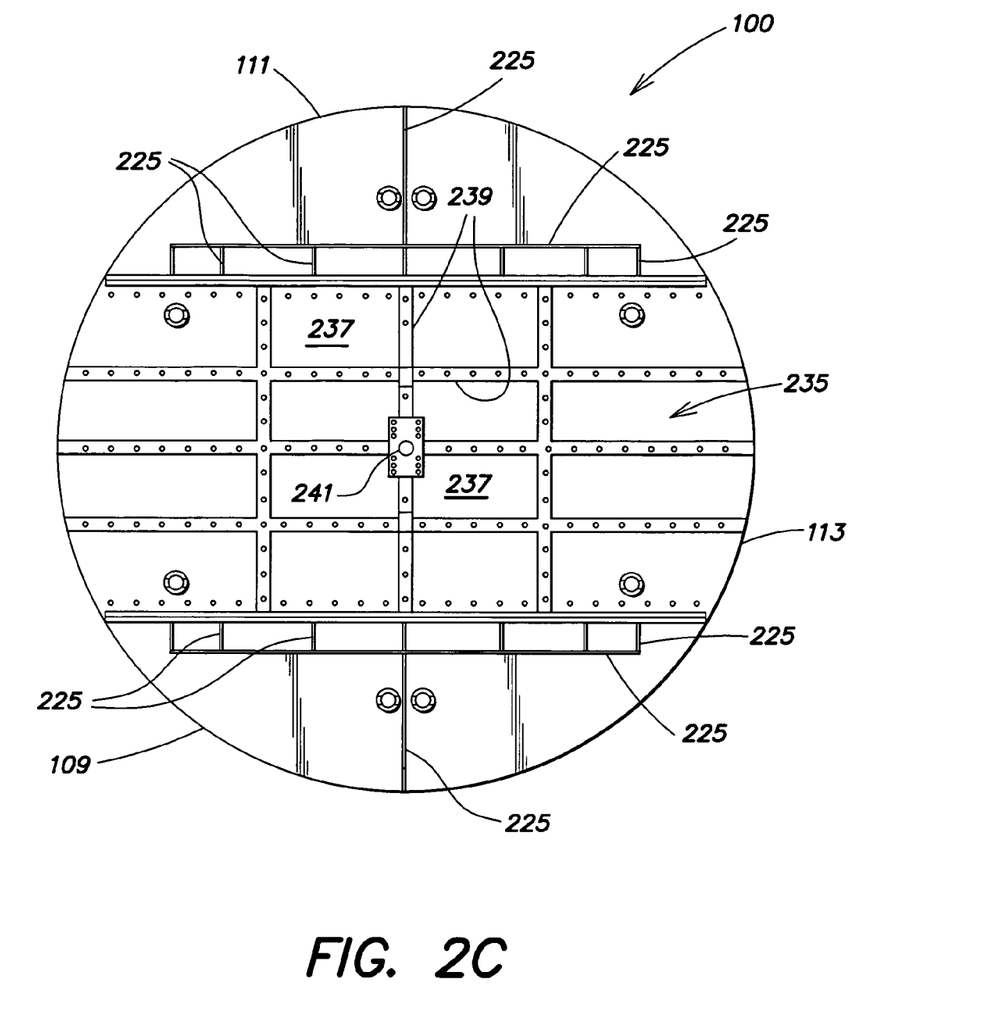
FIG. 2C is a top view of the first chamber of FIG. 2A.
Figure 2D:
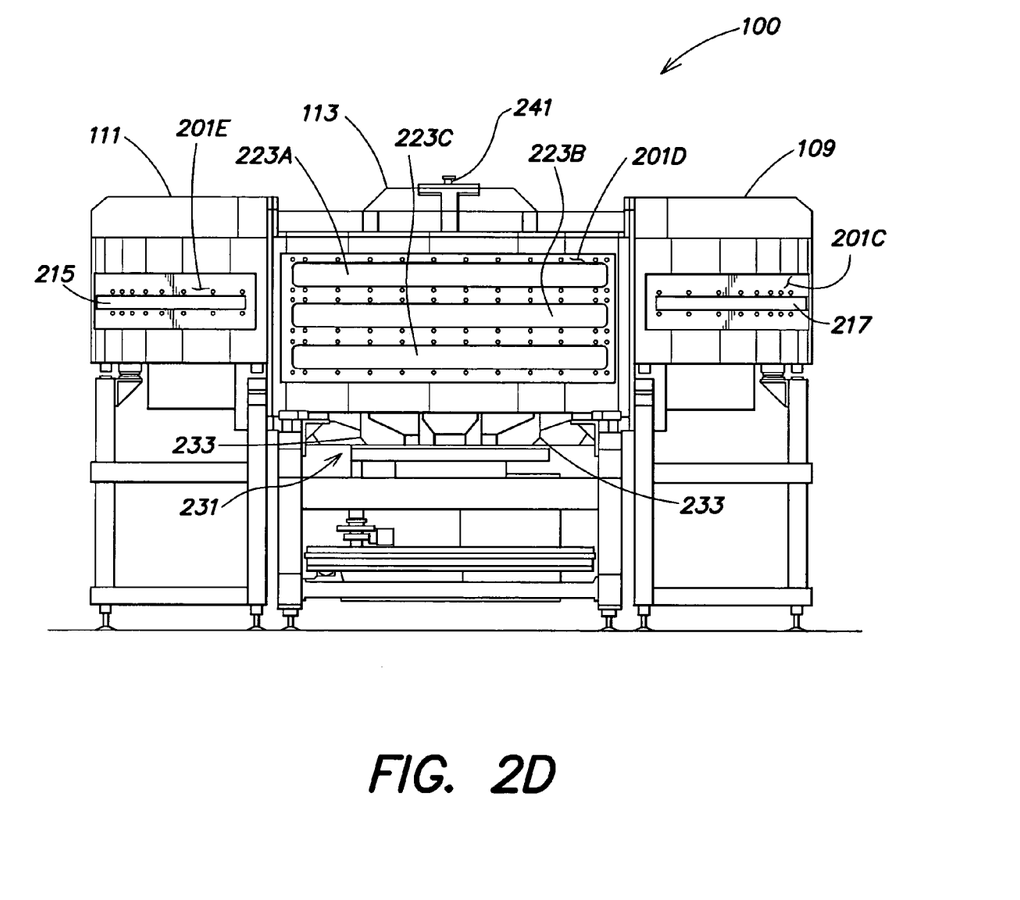
FIG. 2D is a side view of the first chamber of FIG. 2A.

Additional features of the first multi-piece electronic device manufacturing chamber 100 will now be described with reference to FIG. 2A, as well as to FIGS. 2B-2D in which FIG. 2B is an isometric view of the first chamber 100 when assembled; FIG. 2C is a top view of the first chamber 100; and FIG. 2D is a side view of the first chamber 100 (illustrating a facet of the first chamber 100 adapted to couple to a triple substrate stacked load lock chamber as described further below).

With reference to FIGS. 2A-2D, the first chamber 100 includes a plurality of recessed facets 201A-F (201D not visible from the exterior of the chamber). In the embodiment shown, six recessed facets are provided, although a larger or smaller number of facets may be provided.

Each recessed facet 201A-F provides a flat area to which a processing chamber, load lock chamber or other chamber may be sealingly coupled (e.g., via an o-ring or other sealing member) as shown, for example, in FIG. 1 with reference to the chambers 103. Despite the presence of the recessed facets 201A-F, the overall structure of the first chamber 100 is cylindrical. For example, as shown in FIGS. 2A-2C, the first (side) piece 109 includes a cylindrical wall 203 into which recessed facets 201B, 201C are formed, and the second (side) piece 111 includes a cylindrical wall 205 into which recessed facets 201E, 201F are formed. The third (central) piece 113 has cylindrical opposing side walls 207, 209 as shown (FIG. 2A) that include recessed facets 201A, 201D, respectively.

Because of the cylindrical walls 203, 205, 207, 209 of the pieces 109, 111, 113, the interior region of the first chamber 100 is also substantially cylindrical (see, for example, FIG. 2A and FIG. 2C). A cylindrical configuration reduces the interior volume of the first chamber 100 while allowing free rotation of a vacuum robot located within the first chamber 100. Such rotation may occur, for example, when the robot rotates to transfer substrates between the various chambers 103 coupled to the first chamber 100 (FIG. 1).

To accommodate rotations of a vacuum robot through the third (central) piece 113 of the chamber 100, the third piece 113 includes notched regions 211A-D (see FIG. 2A in which only notches 211A-C are shown). The notches 211A-D also provide additional clearance during substrate transfers through openings (e.g., slit openings) formed in respective facets of the first and the second side pieces 109, 111. That is, the notches 211A-D may provide additional clearance during substrate transfers through openings 213, 215, 217, 219, respectively, which correspond to recessed facets 201F, 201E, 201C, 201B (as shown in FIGS. 2A and 2B).

While recessed facets 201B, 201O, 201E, 201F of the first and second pieces 109, 111 are shown as having only one opening, each recessed facet may include additional openings (e.g., 2, 3, 4 or more openings). Likewise, the facet 201A of the third (central) piece 113 is shown having a single opening 221 (FIG. 2A), but may include additional openings (e.g., 2, 3, 4, etc.). The facet 201D (FIG. 2D) of the third piece 113 includes three vertically stacked openings 223A-C (FIG. 2A and FIG. 2D), but may include another number of openings (e.g., 1, 2, 4, 5, etc.). In at least one embodiment of the invention, the middle opening 223B of the recessed facet 201D of the third (central) piece 113 is vertically aligned with the opening 215 of the recessed facet 201e of the second side piece 111 and with the opening 217 of the recessed facet 201C of the first side piece 109 (as shown in FIG. 2D). Note that each opening 213-223c is sized to allow a substrate to pass therethrough. Other configurations or alignments may be employed.

Referring again to FIG. 2A-2B, the first and second side pieces 109, 111 include a plurality of fin structures 225, each adapted to provide structural integrity to the first chamber 100. For example, the fin structures 225 may reduce deflection of the cylindrical side/top walls of the first and second side pieces 109, 111 due to pressure differentials between an interior region of the first chamber 100 and any processing chamber coupled thereto, and/or the environment outside of the first chamber 100. Further, the use of the fin structures 225 allows the wall thicknesses of the first and second pieces 109, 111 to be reduced, and reduces the overall weight of the first chamber 100. In one embodiment, the fin structures 225 have a thickness of about 0.55 inches near the outer side/top walls of the first and second side pieces 109, 111 and of about 1.3 inches near the sealing surfaces of the first and second side pieces 109, 111 that contact the central piece 113 (for stainless steel), although other materials and/or thicknesses may be used.

As further shown in FIG. 2A, a bottom 227 of the third (central) piece 113 of the first chamber 100 includes a flat portion 229 and a domed portion 231 (see also FIG. 2D). The domed portion 231 provides improved strength to the bottom 227, because of its domed shape, and reduces the material thickness requirements for the bottom 227. In one exemplary embodiment, the domed portion 231 may have a thickness of about ⅜" or less while the flat portion 227 may have a thickness of about ¾-1" or less when stainless steel is employed. Other materials and/or thickness values and/or thickness differences between the flat portion 229 and the domed portion 231 may be used. To further increase the strength of the domed portion 231, fins or similar support structures 233 may be formed below the domed portion 231 as shown in FIG. 2D. The use of the fins 233 may reduce, for example, vertical deflections of the domed portion 231.

FIGS. 2B-2C illustrate a top lid 235 that may be employed with the first chamber 100. For example, the lid 235 may be adapted to seal the third (central) piece 113 of the first chamber (by employing an o-ring or similar sealing element between the lid 235 and the third piece 113).

With reference to FIGS. 2B-2C, the top lid 235 includes a flat sealing portion 237 that is reinforced with a plurality of support structures, such as beams 239 as shown. The sealing portion 237 may have a thickness similar to that of the flat portion 229 (FIG. 2A) of the bottom 227 of the chamber 100, and the beams 239 provide additional structural support (allowing the thickness and weight of the lid 235 to be reduced). The lid 235 may include a connection location 241 that may be used for lifting and/or lowering the lid 235 relative to the first chamber 100 (e.g., via a crane or the like).

Because of the weight of the lid 235, it may be desirable to provide one or more access hatches (not shown) or other openings within the lid 235 so that the entire lid 235 need not be removed from the first chamber 100 to gain access to the interior of the first chamber 100 (e.g., for maintenance or other servicing). Any number of access hatches may be included (e.g., 1, 3, 4, etc.).

Figure 3:
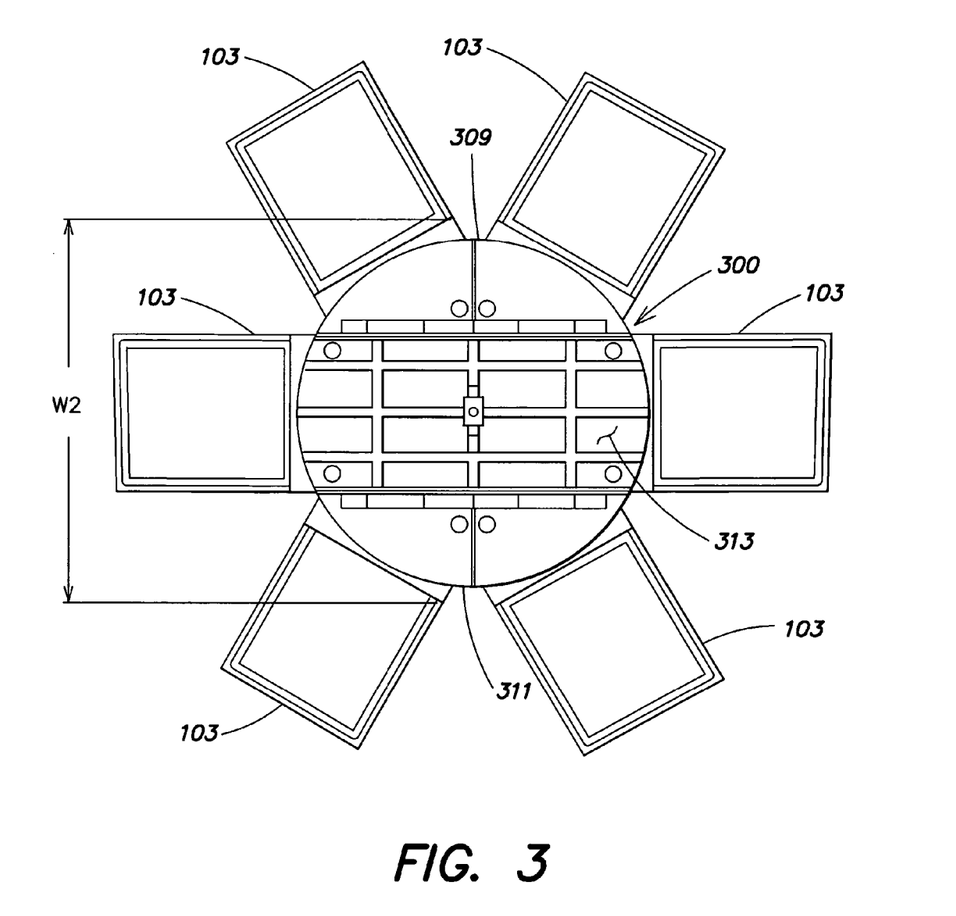
FIG. 3 is an isometric view of a second exemplary multi-piece electronic device manufacturing chamber in accordance with some embodiments of the present invention.

FIG. 3 is a top view of a second exemplary multi-piece electronic device manufacturing chamber 300 in accordance with some embodiments of the present invention. With reference to FIG. 3, the second embodiment of a multi-piece electronic device manufacturing chamber 300 is also a transfer chamber for transporting substrates during electronic device manufacturing. The transfer chamber 300 is coupled to one or more processing chambers and/or load locks 103 during electronic device manufacturing. The transfer chamber 300 may include an end effector (not shown) for transporting a substrate among the processing chambers and/or load locks 103 during electronic device manufacturing.

In accordance with some embodiments of the invention, the transfer chamber 300 may include multiple pieces which are coupled together. More specifically, the transfer chamber 300 may include a first piece 309 (e.g., a first side piece) and a second piece 311 (e.g., a second side piece) coupled to a third piece 313 (e.g., a center piece). The first piece 309 and second piece 311 may each be coupled to the third piece 313 via an O-ring (not separately shown). The first piece 309 and second piece 311 may each be secured to the third piece 313 using securing means, such as screws, bolts, or the like. Although, the multi-piece electronic device manufacturing chamber 300 of FIG. 3 includes three pieces, the multi-piece electronic device manufacturing chamber may include a larger or smaller number of pieces (e.g., 2, 4, 5, 6, etc.).

In one or more embodiments of the present invention, the width W2 of the multi-piece transfer chamber, when assembled (e.g., the overall width), is 4.2 meters. Therefore, the present electronic device manufacturing chamber 300 can accommodate a larger substrate than can conventional, one-piece transfer chambers. The electronic device manufacturing chamber 300 may be of a larger or smaller width than 4.2 meters.

In accordance with some embodiments of the invention, from a top view or a lateral cross-sectional view, the shapes of each of the exemplary multi-piece electronic device manufacturing chamber pieces 309-313 resembles a circle cut by one or more cords. For example, from a top view or a lateral cross-sectional view, the side pieces 309, 311 resembles a portion of a circle (or, more generally, an ellipse) cut by a cord. Likewise, from a top view or a lateral cross-sectional view, the center piece 313 resembles a portion of a circle cut by two parallel cords. This shape includes two curve segments and two line segments. The shapes of the side pieces 309,311 include a curve segment and a line segment. Note that none of the individual pieces 309-313 has a polygon shape. In other words, each of the pieces 309-313 include at least one curve segment.

From a top view, or a lateral cross-sectional view, the shape of the second exemplary multi-piece electronic device manufacturing chamber 300 when assembled (e.g., the combined shape) is a circle. The overall shape of the second exemplary multi-piece electronic device manufacturing chamber 300 when assembled (e.g., the three dimensional shape) is substantially cylindrical. However, the multi-piece electronic device manufacturing chamber 300 may have other overall shapes (e.g., ecliptically cylindrical) including various non-polygonal shapes. As noted above, such non-polygonal shaped chambers, particularly symmetrical non-polygonal shaped chambers (e.g., a cylinder shaped chamber) may provide increase useable internal substrate transfer area for a given amount of chamber material.

Figure 4A:
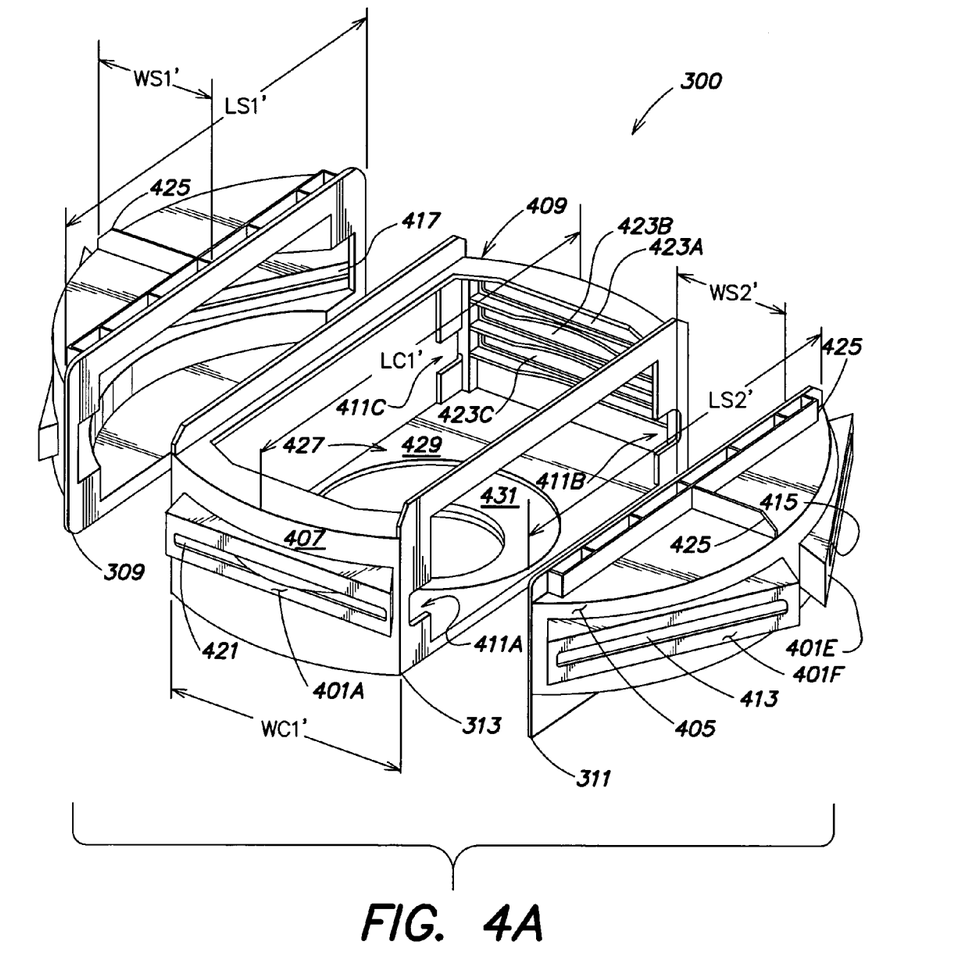
FIG. 4A is an exploded isometric view of the second exemplary multi-piece electronic device manufacturing chamber of FIG. 3 in accordance with some embodiments of the present invention.

FIG. 4A is an exploded isometric view of the second exemplary multi-piece electronic device manufacturing chamber 300 (rotated relative to the depiction in FIG. 3) in accordance with some embodiments of the present invention. Each of the first through third pieces 309-313 may be coupled horizontally to form the multi-piece electronic device manufacturing chamber 300. The length of the first piece 309 is represented by LS1' and the largest width (e.g., the width at the widest point) of the first piece 309 is represented by WS1'. The length of second piece 311 is represented by LS2' and the largest width of the second piece 311 is represented by WS2'. The largest length (e.g., the length at the longest point) of the third piece 313 is represented by LC1' and the width of the third piece 313 is represented by WC1'.

In one or more embodiments, the largest width WC1' of the third piece 313 is about 2.4 m and the largest length LC1' of the third piece 313 is about 4.2 meters. Larger or smaller lengths and/or widths may be employed for the third piece 313. In the embodiment shown, the largest length LC1' of the third piece 313 is also the overall diameter of the chamber 300. As shown, the length LS1' of the first piece 309 and the length LS2' of the second piece 311 are equal to the length of the sides of third piece 313. However, the length LS1' of the first piece 309 and/or the length LS2' of the second piece 311 may be different. In one embodiment the width WS1' of the first piece 309 and/or the width WS2' of the second piece 311 are each about 0.9 meters. However, the width WS1' of the first piece 309 and/or the width WS2' of the second piece 311 may be different (e.g., larger or smaller) and/or different than each other. (In one particular embodiment, the third piece 313 may have a width that is approximately equal to or less than the width of the first piece 309 plus the width of the second piece 311, although other relationships between the widths of the first, second and third pieces 309, 311 and 313 may be employed).

Each piece 309-313 of the multi-piece electronic device manufacturing chamber 300 may be made of, for example, aluminum, stainless steel, or any practicable, relatively inert material suitable for use as a transfer chamber.

Although the overall dimensions of the multi-piece electronic device manufacturing chamber 300 do not comply with ground and/or air transportation regulations, the dimensions of each piece 309-313 of the multi-piece electronic device manufacturing chamber 300 do comply with ground and/or air transportation regulations. More specifically, in the example described above, the overall width W2 of the multi-piece electronic device manufacturing chamber 300 is 4.2 m, which does not comply with ground and/or air transportation regulations. However, the width WS1' of the first piece 309 and the width WS2' of the second piece 311 are each 0.9 m and the width WC1' of the third piece 313 is 2.4 m, each of which complies with ground and/or air transportation regulations. (In another embodiment, the width WC1' of the third piece 313 may be about 3 to 3.2 m and the widths WS1', WS2' of the first and second pieces 309, 311 may each be about 0.5 to 0.6 m.)

Further, each piece 309-313 of the multi-piece electronic device manufacturing chamber 300 may be fabricated in a conventional machining center or shop. Therefore, as with the multi-piece electronic device manufacturing chamber 100 described above, a manufacturer of the multi-piece electronic device manufacturing chamber 300 may select one or more of a plurality of conventional machining centers or shops to fabricate the pieces 309-313 of the multi-piece electronic device manufacturing chamber 300. Also, the multi-piece electronic device manufacturing chamber 300 does not require special transportation accommodations.

Figure 4B:
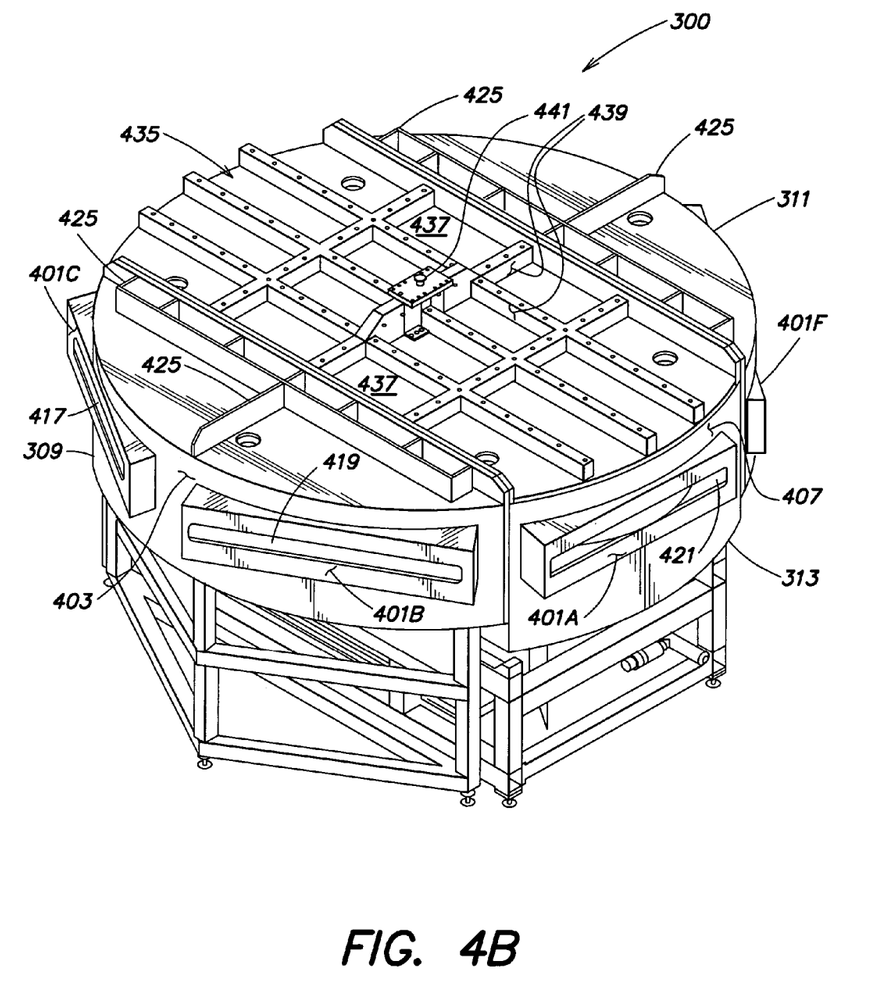
FIG. 4B is an isometric view of the second chamber of FIG. 4A when assembled.
Figure 4C:
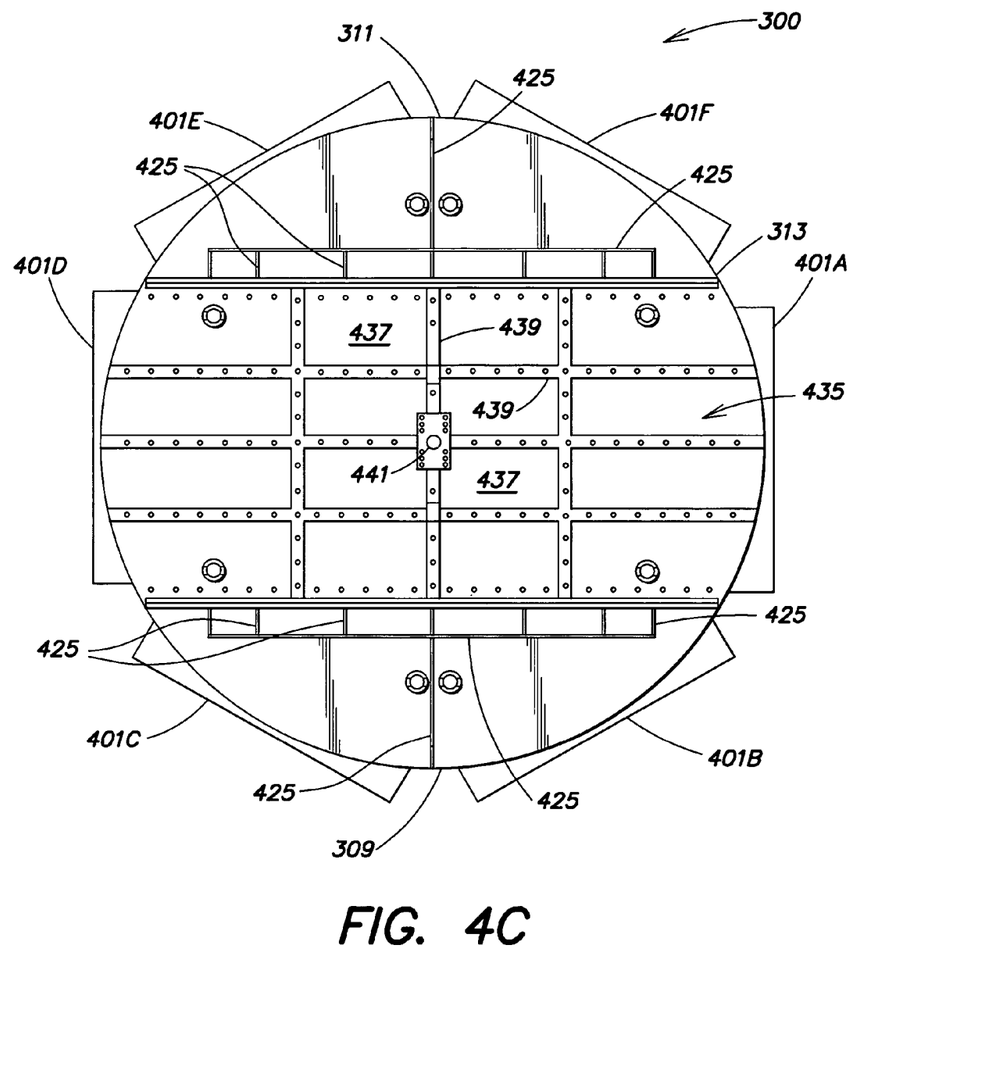
FIG. 4C is a top view of the second chamber of FIG. 4A.
Figure 4D:
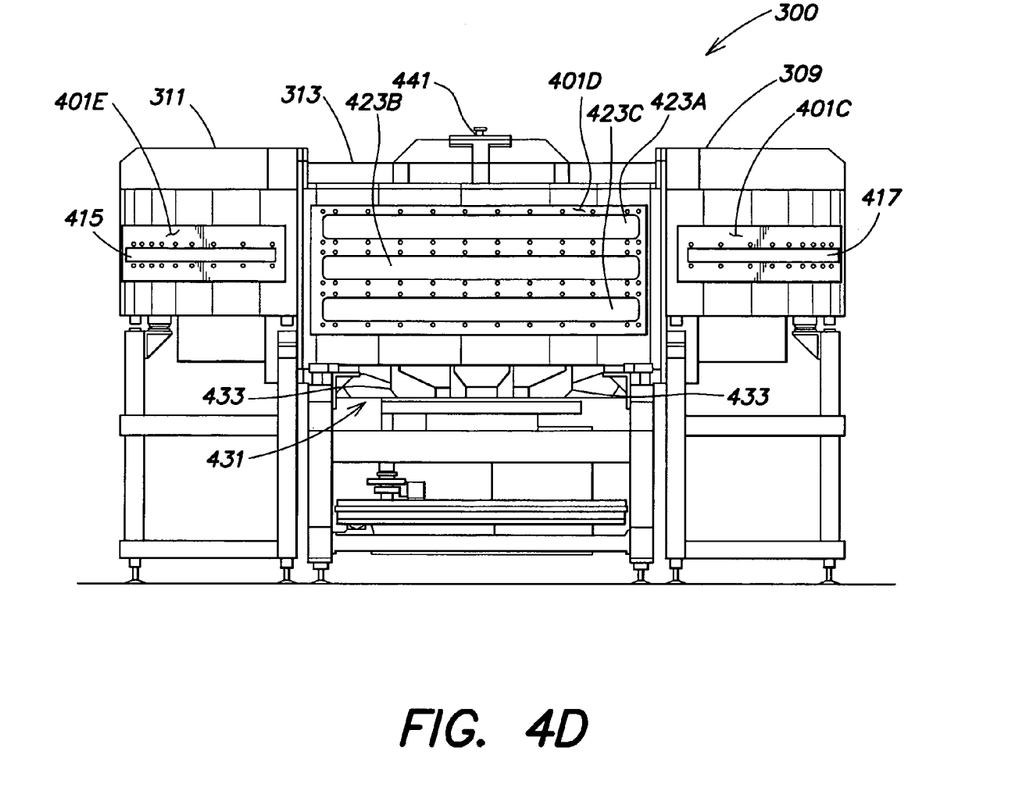
FIG. 4D is a side view of the second chamber of FIG. 4A.

Additional features of the first multi-piece electronic device manufacturing chamber 300 will now be described with reference to FIG. 4A, as well as to FIGS. 4B-4D in which FIG. 4B is an isometric view of the second chamber 300 when assembled; FIG. 4C is a top view of the second chamber 300; and FIG. 4D is a side view of the second chamber 300 (illustrating a facet of the second chamber 300 adapted to couple to a triple substrate stacked load lock chamber as described further below).

With reference to FIGS. 4A-4D, the second chamber 300 includes a plurality of extended facets 401A-F that protrude from the curved sidewalls of the chamber 300. In the embodiment shown, six extended facets are provided, although a larger or smaller number of facets may be provided.

Each extended facet 401A-F provides a flat area to which a processing chamber, load lock chamber or other chamber may be sealingly coupled (e.g., via an o-ring or other sealing member) as shown, for example, in FIG. 3 with reference to the chambers 103. Despite the presence of the extended facets 401A-F, the overall structure of the first chamber 300 is substantially cylindrical. For example, as shown in FIGS. 4A-4C, the first (side) piece 309 includes a cylindrical wall 403 from which extended facets 401B, 401C protrude, and the second (side) piece 311 includes a cylindrical wall 405 from which extended facets 401E, 401F protrude. The third (central) piece 313 has cylindrical opposing side walls 407, 409 as shown (FIG. 4A) that include extended facets 401A, 401D, respectively.

Because of the cylindrical walls 403, 405, 407, 409 of the pieces 309, 311, 313, the interior region of the second chamber 300 is also substantially cylindrical (see, for example, FIG. 4A and FIG. 4C). A cylindrical configuration reduces the interior volume of the second chamber 300 while allowing free rotation of a vacuum robot located within the second chamber 300. Such rotation may occur, for example, when the robot rotates to transfer substrates between the various chambers 103 coupled to the first chamber 300 (FIG. 3).

To accommodate rotations of a vacuum robot through the third (central) piece 313 of the chamber 300, the third piece 313 includes notched regions 411A-D (see FIG. 4A in which only notches 411A-C are shown). The notches 411A-D also provide additional clearance during substrate transfers through openings (e.g., slit openings) formed in respective facets of the first and the second side pieces 309, 311. That is, the notches 411A-D may provide additional clearance during substrate transfers through openings 413, 415, 417, 419, respectively, which correspond to facets 401F, 401E, 401C, 401B (as shown in FIGS. 4A and 4B).

While extended facets 401B, 401C, 401E, 401F of the first and second pieces 309, 311 are shown as having only one opening, each extended facet may include additional openings (e.g., 2, 3, 4 or more openings). Likewise, the extended facet 401A of the third (central) piece 313 is shown having a single opening 421 (FIG. 4A), but may include additional openings (e.g., 2, 3, 4, etc.). The extended facet 401D (FIG. 4D) of the third piece 313 includes three vertically stacked openings 423A-C (FIG. 4A and FIG. 4D), but may include another number of openings (e.g., 1, 2, 4, 5, etc.). In at least one embodiment of the invention, the middle opening 423B of the extended facet 401D of the third (central) piece 313 is vertically aligned with the opening 415 of the extended facet 401e of the second side piece 311 and with the opening 417 of the extended facet 401C of the first side piece 309 (as shown in FIG. 4D). Note that each opening 413-423c is sized to allow a substrate to pass therethrough. Other configurations or alignments may be employed.

Referring again to FIG. 4A-4B, the first and second side pieces 309, 311 include a plurality of fin structures 425, each adapted to provide structural integrity to the second chamber 300. For example, the fin structures 425 may reduce deflection of the cylindrical side/top walls of the first and second side pieces 309, 311 due to pressure differentials between an interior region of the second chamber 300 and any processing chamber coupled thereto, and/or the environment outside of the first chamber 300. Further, the use of the fin structures 425 allows the wall thicknesses of the first and second pieces 309, 311 to be reduced, and reduces the overall weight of the second chamber 300. In one embodiment, the fin structures 425 have a thickness of about 0.55 inches near the outer side/top walls of the first and second side pieces 309, 311 and of about 1.3 inches near the sealing surfaces of the first and second side pieces 309, 311 that contact the central piece 313 (for stainless steel), although other materials and/or thicknesses may be used.

As further shown in FIG. 4A, a bottom 427 of the third (central) piece 313 of the second chamber 300 includes a flat portion 429 and a domed portion 431 (see also FIG. 4D). The domed portion 431 provides improved strength to the bottom 427, because of its domed shape, and reduces the material thickness requirements for the bottom 427. In one exemplary embodiment, the domed portion 431 may have a thickness of about 3/8" or less while the flat portion 427 may have a thickness of about 3/4-1" or less when stainless steel is employed. Other materials and/or thickness values and/or thickness differences between the flat portion 429 and the domed portion 431 may be used. To further increase the strength of the domed portion 431, fins or similar support structures 433 may be formed below the domed portion 431 as shown in FIG. 4D. The use of the fins 433 may reduce, for example, vertical deflections of the domed portion 431.

FIGS. 4B-4C also illustrate a top lid 435 that may be employed with the second chamber 300. For example, the lid 435 may be adapted to seal the third (central) piece 313 of the first chamber (by employing an o-ring or similar sealing element between the lid 435 and the third piece 313).

With reference to FIGS. 4B-4C, the top lid 435 includes a flat sealing portion 437 that is reinforced with a plurality of support structures, such as beams 439 as shown. The sealing portion 437 may have a thickness similar to that of the flat portion 429 (FIG. 4A) of the bottom 427 of the chamber 300, and the beams 439 provide additional structural support (allowing the thickness and weight of the lid 435 to be reduced). The lid 435 may include a connection location 441 that may be used for lifting and/or lowering the lid 235 relative to the second chamber 300 (e.g., via a crane or the like).

Figure 5:
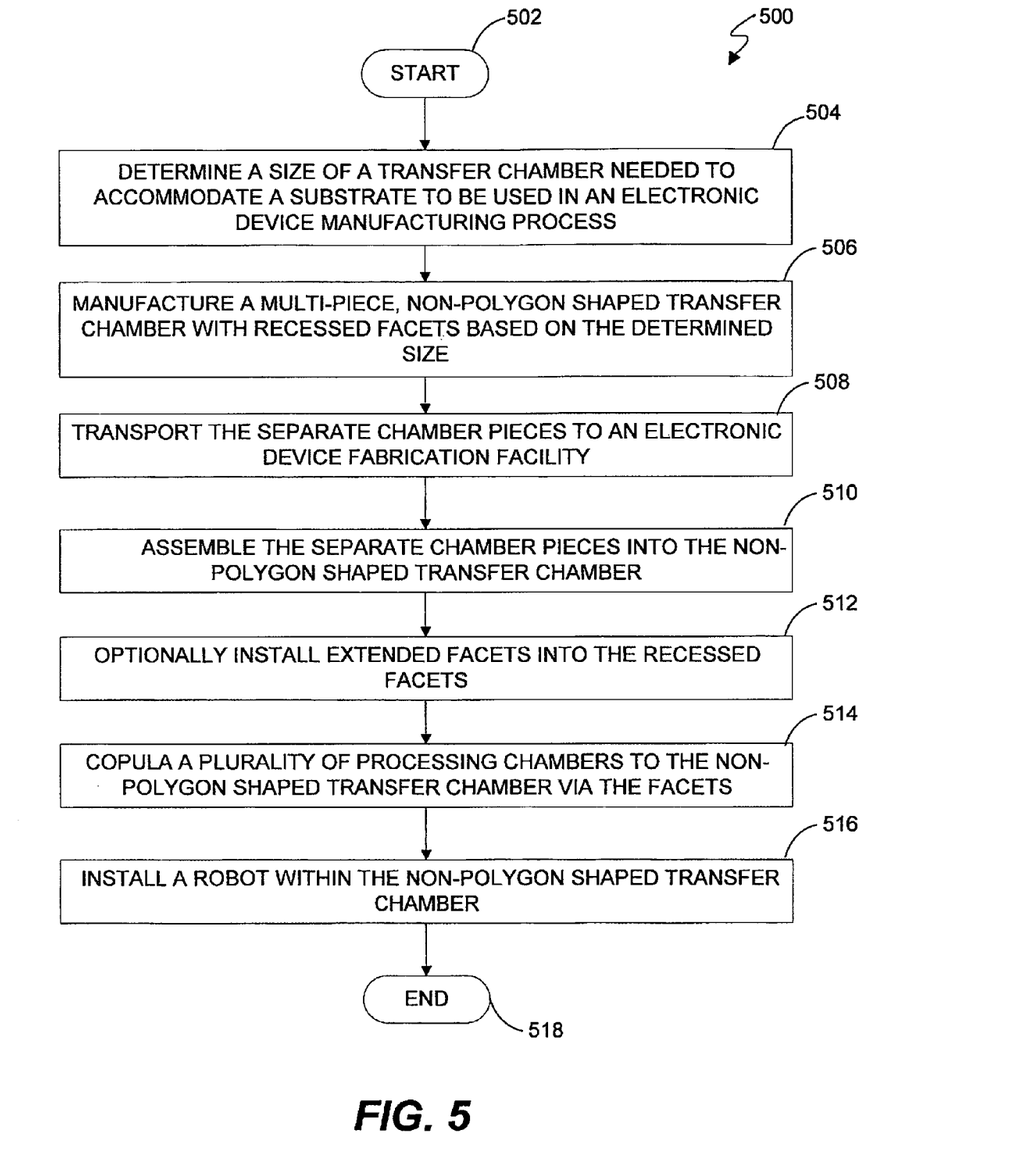
FIG. 5 is a flow chart depicting some method embodiments of the present invention.

To manufacture a multi-piece electronic device manufacturing chamber 100, 300, a user, such as a manufacturer, may employ the inventive method 500 described below with respect to FIG. 5. The method 500 commences at step 502. According to the inventive method 500, in step 504, one or more overall dimensions of the electronic device manufacturing chamber is determined. More specifically, a manufacturer may need to manufacture a substrate of a required size. Based on the required size, the manufacturer may determine (e.g., design) one or more overall dimensions of an electronic device manufacturing chamber capable of manufacturing such a substrate. If the required substrate size is large enough, the overall dimensions of the chamber will not comply with at least one of ground and air transportation regulations.

Thereafter, in some embodiments, the manufacturer, for example, may determine how to divide the electronic device manufacturing chamber into a plurality of pieces such that the dimensions of each of the plurality of pieces complies with at least one of ground and air transportation regulations and at the same time, the structural integrity of the chamber when assembled will be sufficient to perform manufacturing operations. For example, the manufacturer may divide the designed multi-piece electronic device manufacturing chamber into pieces using vertical sectioning, such as with the electronic device manufacturing chambers 100, 300 shown in FIGS. 1-4. Horizontal sectioning is also possible. The manufacturer may decide to divide the electronic device manufacturing chamber into pieces using sectioning having other orientations or combinations of orientations.

Thereafter, in step 506, the plurality of pieces are manufactured. For example, the manufacturer may employ a machining center or shop to fabricate the plurality of pieces. In this manner, the multi-piece electronic device manufacturing chamber 100, 300 is manufactured.

Once the electronic device manufacturing chamber 100, 300 is manufactured, the electronic device manufacturing chamber 100, 300 may be transported, for example, to a customer site in step 508. To transport a multi-piece electronic device manufacturing chamber 100, 300, the manufacturer may employ a method of transporting such a chamber in accordance with one or more embodiments of the present invention. For example, a first piece of a plurality of electronic device manufacturing chamber pieces may be transported via one of ground and air transportation. The first piece may be placed in a container that complies with transportation regulations such that the first piece forms an angle with a side (such as a bottom side) of the container. Thus, the first piece may have an actual height or width dimension larger than permitted if it was not placed in the container at such an angle, yet may still fit within a container that complies with transportation regulations. The ability to ship larger pieces allows the inventive multi-piece chamber to be formed from fewer pieces. Therefore, placing the pieces at an angle within the shipping container may be preferred, though not required. In some embodiments it may be preferred to manufacture a multi-piece chamber such that a main or central piece is as large as possible and still capable of fitting into a standard size shipping container while the remaining pieces are smaller or as small as possible so that assembly is easier.

Once the pieces arrive at, for example, the customer site, the pieces may be assembled to form the electronic device manufacturing chamber 100, 300 in step 510. In some embodiments, extended facets may be installed into or in replacement of the recessed facets 201A-F of the electronic device manufacturing chamber 100 in step 512. In such embodiments, the extended facets may aid in coupling load locks and/or processing chambers to the electronic device manufacturing chamber 100. In certain embodiments, extended facets added to recessed facets 201A-F may extend completely outside the outer circumference of the electronic device manufacturing chamber 100 so that the resulting chamber appears similar to the embodiment depicted in FIG. 4A. In other embodiments, extended facets added to recessed facets 201A-F may only extend partially beyond the outer circumference of the electronic device manufacturing chamber 100. Extended facets may include a flat area (for coupling a load lock or processing chamber) with an opening (sized to allow the passage of a substrate) and an adapter portion that fits sealingly into the recess of a recessed facet 201A-F.

In step 514, load locks and/or processing chambers may be coupled to the facets of the electronic device manufacturing chamber 100, 300. In step 516, a robot, adapted to move substrates between the processing chambers via the non-polygon shaped transfer chamber may be installed within the electronic device manufacturing chamber 100, 300. The method 500 is completed in step 518.

Accordingly, while the present invention has been disclosed in connection with exemplary embodiments thereof, it should be understood that other embodiments may fall within the spirit and scope of the invention, as defined by the following claims.

The invention claimed is:

1. A method comprising:
    transporting a plurality of separate chamber pieces that are adapted to fit together to form a non-polygon shaped transfer chamber, the separate chamber pieces including a plurality of recessed facets, each recessed facet being adapted to be a coupling point to another chamber and including at least one opening; and
    assembling the separate chamber pieces into the non-polygon shaped transfer chamber,
    wherein the non-polygon shaped transfer chamber is an electronic device transfer chamber used in the manufacture of electronic devices.

2. The method of claim 1 further comprising coupling a plurality of processing chambers to the non-polygon shaped transfer chamber via the recessed facets.

3. The method of claim 1 further comprising installing extended facets into the recessed facets.

4. The method of claim 3 further comprising coupling a plurality of processing chambers to the non-polygon shaped transfer chamber via the extended facets.

5. The method of claim 1 further comprising installing a robot within the non-polygon shaped transfer chamber, the robot being adapted to pass a substrate between processing chambers coupled to the non-polygon shaped transfer chamber.

6. A method comprising:
    transporting a plurality of separate chamber pieces that are adapted to fit together to form a non-polygon shaped transfer chamber, the separate chamber pieces including a plurality of recessed facets, each recessed facet being adapted to be a coupling point to another chamber and including at least one opening;
    assembling the separate chamber pieces into the non-polygon shaped transfer chamber; and
    coupling a plurality of processing chambers to the non-polygon shaped transfer chamber.

7. The method of claim 6 wherein the plurality of processing chambers are coupled to the non-polygon shaped transfer chamber via the recessed facets.

8. The method of claim 6 further comprising installing extended facets into the recessed facets.

9. The method of claim 8 wherein the plurality of processing chambers are coupled to the non-polygon shaped transfer chamber via the extended facets.

10. A method comprising:
    transporting a plurality of separate chamber pieces that are adapted to fit together to form a non-polygon shaped transfer chamber, the separate chamber pieces including a plurality of recessed facets, each recessed facet being adapted to be a coupling point to another chamber and including at least one opening;
    assembling the separate chamber pieces into the non-polygon shaped transfer chamber; and
    installing a robot within the non-polygon shaped transfer chamber, the robot being adapted to pass a substrate between processing chambers coupled to the non-polygon shaped transfer chamber.

* * * * *